(12) United States Patent
Hong et al.

(10) Patent No.: US 9,311,968 B2
(45) Date of Patent: Apr. 12, 2016

(54) READ TRACKING MECHANISM

(71) Applicant: TAIWAN SEMICONDUCTOR MANUFACTURING COMPANY, LTD., Hsinchu (TW)

(72) Inventors: Hyun-Sung Hong, Kanata (CA); Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 109 days.

(21) Appl. No.: 14/030,497

(22) Filed: Sep. 18, 2013

(65) Prior Publication Data
US 2015/0078110 A1    Mar. 19, 2015

(51) Int. Cl.
| | | |
|---|---|---|
| G11C 7/08 | (2006.01) |
| G11C 7/06 | (2006.01) |
| G11C 7/00 | (2006.01) |
| G11C 7/22 | (2006.01) |

(52) U.S. Cl.
CPC .. *G11C 7/06* (2013.01); *G11C 7/08* (2013.01); *G11C 7/227* (2013.01)

(58) Field of Classification Search
CPC ............... G11C 7/00; G11C 7/06; G11C 7/08
USPC .................................................. 365/191, 194
See application file for complete search history.

(56) References Cited

U.S. PATENT DOCUMENTS

| | | | |
|---|---|---|---|
| 7,286,379 B1 * | 10/2007 | Sun ............................. 365/49.17 |
| 2009/0279373 A1 * | 11/2009 | Han ............................... 365/222 |
| 2012/0051160 A1 * | 3/2012 | Tao et al. ....................... 365/191 |
| 2012/0206983 A1 * | 8/2012 | Zhang et al. ................... 365/194 |
| 2014/0241077 A1 * | 8/2014 | Katoch et al. ........... 365/189.011 |

* cited by examiner

*Primary Examiner* — Huan Hoang
*Assistant Examiner* — Muna A Techane
(74) *Attorney, Agent, or Firm* — Hauptman Ham, LLP (57) ABSTRACT

A read time tracking mechanism (RTTM) for ensuring sufficient read time is provided. The read time tracking mechanism includes a read tracking circuit, which includes a tracking bit line (TBL) tracking circuit with one or more tracking cells, and a tracking word line (TWL). The RTTM also includes a sense amplifier enable (SAE) timing device configured to change the logic threshold of tracking WL (TWL) to delay the timing of signal change of TWL when necessary to ensure sufficient read time. The read time tracking mechanism is used to provide sufficient read time for memory arrays with various configurations, prepared under various process conditions, and operated under various voltages, and temperatures.

20 Claims, 9 Drawing Sheets

READ TRACKING MECHANISM

RELATED APPLICATION

The present application is related to U.S. application Ser. No. 13/627,108, entitled "Multiple Bitcells Tracking Scheme for Semiconductor Memory Array," filed on Sep. 26, 2012, and U.S. application Ser. No. 13/273,705, entitled "Tracking Bit Cell," filed on Oct. 14, 2011. Both of the above-mentioned applications are incorporated herein by reference in their entireties.

BACKGROUND

Semiconductor memory devices are continually shrinking in size while at the same time increasing in density or volume and operating at a lower power. The operations of memory devices are synchronized based on clock signals, which may reach different parts of a memory device at different times. A difference in signal paths results in various problems including a reduced read time margin, which may lead to data being improperly read from the memory.

Read tracking circuits for memory cells provide signals based on which read signals for memory cells having data written therein are generated. Generally, the read tracking circuits are designed such that a worst case condition for reading memory cells is covered. For advanced semiconductor memory devices, designing proper read tracking circuits is a challenge.

DETAILED DESCRIPTION

One example of a semiconductor memory device, a static random access memory (SRAM), includes a plurality of memory cells arranged in rows and columns. Each memory cell includes four or six transistors that form a latch for storing a bit of information, in some embodiments. Additionally, each memory cell is connected to one of a plurality of write word lines (WWL) and one of a plurality of read word lines (RWL), both of which extend horizontally across an SRAM array forming a plurality of rows. The memory cells are also coupled to one of a plurality of differential write bit line including WBL and its inverse WBL_. A read bit line (RBL) is also coupled to the memory cells. WBL, WBL_, and RBL all extend across the SRAM array to form a plurality of columns.

Data is written to the memory cells by controlling the voltages on the WWL and providing the data on bit lines WBL and WBL_ to be transferred to a storage node of the memory cell. Data is read from the memory cells by controlling a voltage of the RWL and sensing a resultant voltage that develops on the RBL. The process of writing data to and reading data from the memory cells takes a certain amount of time, which varies based on a distance between the memory cell and a memory controller as well as on variances across the SRAM due to process, voltage, and temperature ("PVT").

Consequently, SRAM arrays, and other semiconductor memories such as dynamic random access memories ("DRAMs"), also include tracking circuitry to detect delays in signals transmitted through the array. The delays detected through the use of tracking signals are used to adjust a timing of the memory control signals to help ensure a read time margin is sufficient such that data is able to be properly read from the memory.

Figure 1:
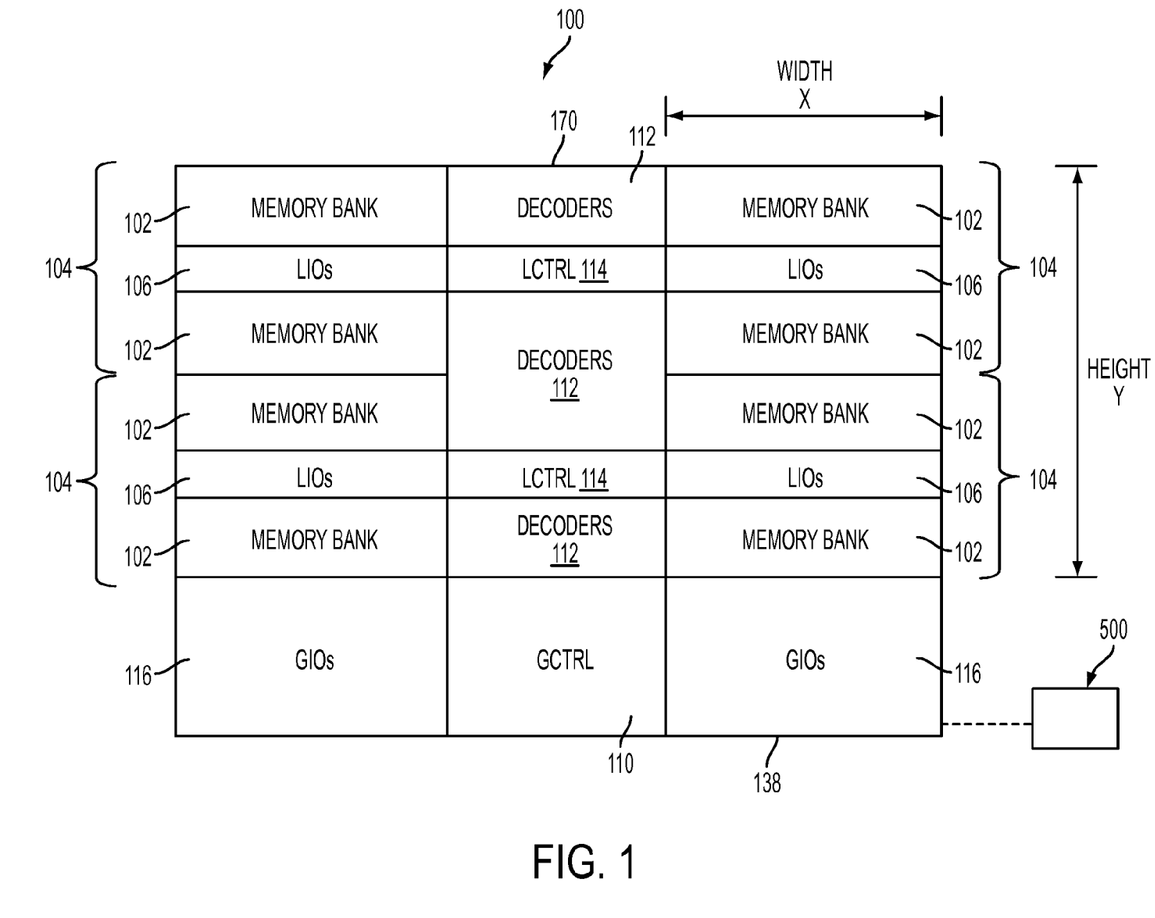
FIG. 1 is a block diagram of a layout of a semiconductor memory in accordance with some embodiments.

FIG. 1 is a block diagram of a static random access memory ("SRAM") array 100, in accordance with some embodiments. SRAM array 100 includes a number of memory banks 102, which are made of memory cells. Although an SRAM array is described, one skilled in the art will understand that the disclosed system and method may be adapted for other semiconductor memories including, but not limited to, dynamic random access memories ("DRAMs"), erasable programmable read only memories ("EPROMs"), and electronically erasable programmable read only memories ("EEPROMs") as well as other read only memories ("ROMs"), random access memories ("RAMs"), and flash memories.

SRAM array 100 may be divided into one or more segments 104 with each segment 104 including a plurality of memory banks 102 separated by local input/output (LIO) circuits 106. Reading from and writing to the memory cell banks 102 is controlled by global control ("GCTRL") circuit 110, which is coupled to address decoders 112, local control ("LCTRL") circuit 114, and global input/output ("GIO") circuits (GIOs) 116. For example, GCTRL circuit 110, which may include a clock (or two clocks, one for read and one for write) for controlling reading and writing to and from memory cells of the SRAM 100, provides an address and a control signal for reading data from or writing data to a memory cell in one of the segments 104. The address is decoded by one of the address decoders 112. An LCTRL circuit 114 identifies a type of operation being performed and transmits a signal to an LIO 106 for controlling the data access in a segment 104. Decoders 112, LCTRL 114 and GCTRL 110 are placed in a control region 170 in a central region of SRAM array 100. For illustration, one memory array on the right side is labeled as memory array 138, which has a width X and a height Y. In some embodiments, SRAM array 100 is coupled to a system 500 for storing a memory compiler.

As mentioned above, tracking circuitry is used to detect delays in signals transmitted through the array to adjust the timing of the memory. A read tracking circuitry includes one or more tracking cells and a number of loading memory cells. In some embodiments, the tracking circuitry includes one or more tracking cells connected by a tracking word line (TWL) and a tracking bit line (TBL). Read tracking circuitry also includes a sense amplifier enable (SAE) signal generator, which sends timing signal to a sense amplifier (SA), which sense the logic levels from a bit line, and amplifies the small voltage swing to recognizable logic levels to be interpreted properly at the output terminal. If SAE signal is sent too early, a read failure may occur at the SA output. Conversely, if the SAE signal is sent too late, the read access time increases unnecessarily.

Figure 2:
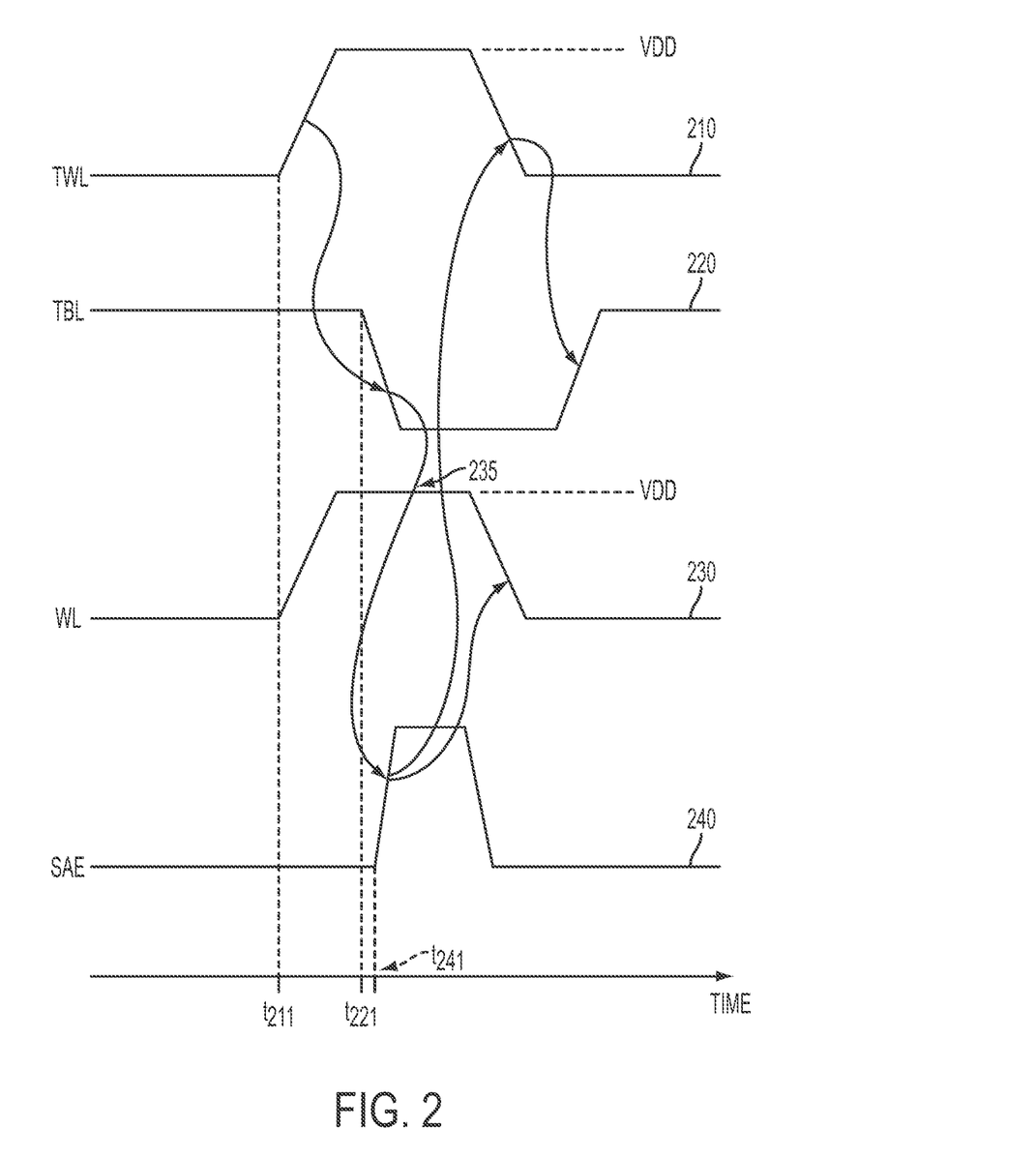
FIG. 2 is a graph of signal curves of various signal lines and sense amplifier enable (SAE), in accordance with some embodiments.

FIG. 2 is a graph of signal curves of various lines in a read tracking circuit and SAE, in accordance with some embodiments. Signal curve 210 shows the signal level of a TWL of the read tracking circuitry as a function of time. Similarly, signal curve 220 shows the signal level of a TBL of the read tracking circuit. Signal curve 230 shows the signal curve of a word line (WL) (a random WL) in SRAM 100. The memory cells on the WL are accessed and read. Signal curve 240 shows the signal level of SAE. FIG. 2 indicates that the TWL receives a signal at a time $t_{211}$ to change the TWL signal from a low to a high (see curve 210). The WL also receives the signal around time $t_{211}$, as shown in curve 230. The received signal turns on the one or more tracking bit cell(s) in the read tracking circuitry to generate a signal on the TBL at a time $t_{221}$, as shown in FIG. 2. The signal on the SAE signal generator generates a SAE signal at a time $t_{241}$, as shown in curve 240. FIG. 2 indicates that curve 230 of WL reaches a plateau region 235 (at $V_{DD}$), which allows sufficient read time. $V_{DD}$ is a supply voltage.

Figure 3:
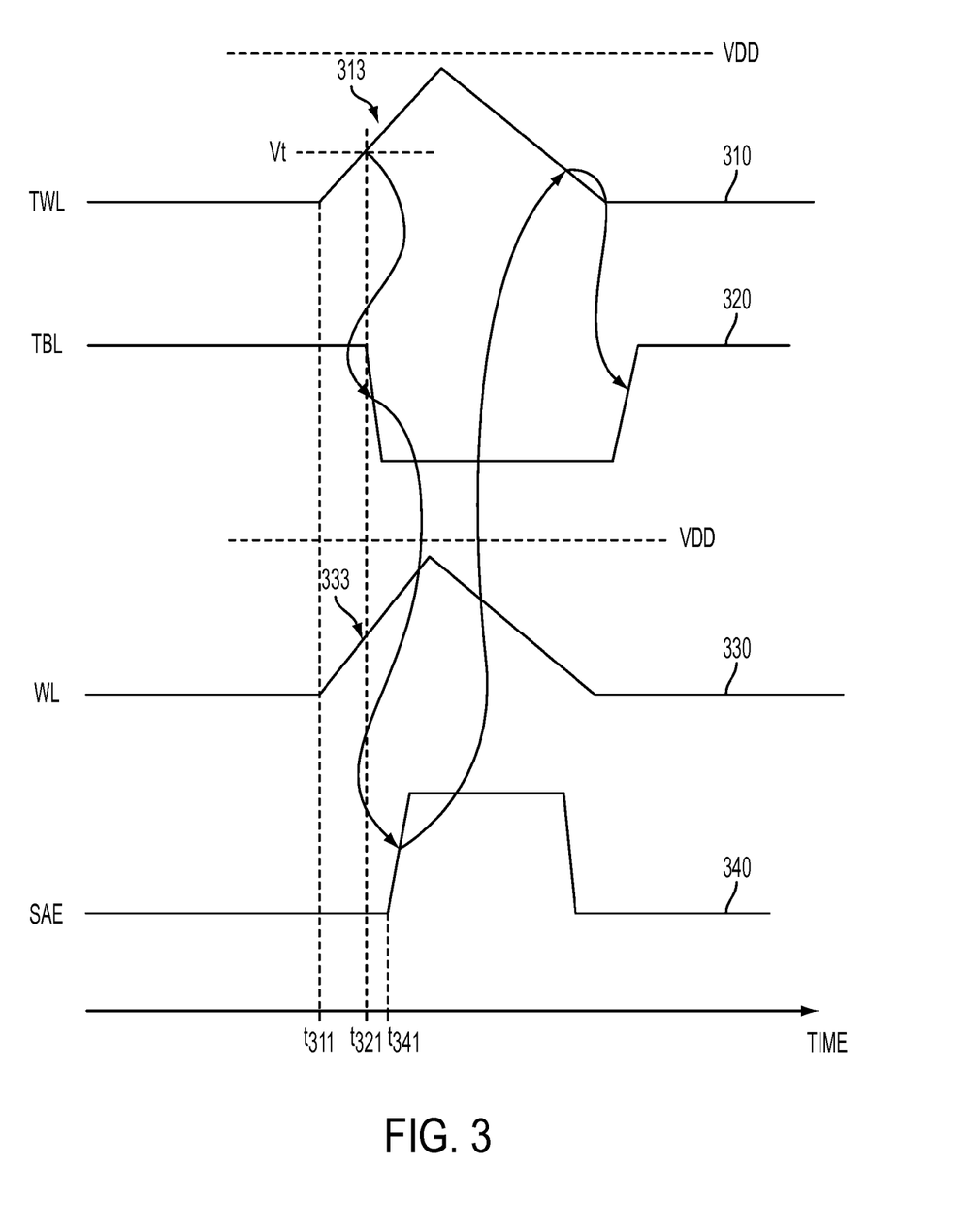
FIG. 3 is a graph of signal curves of various signal lines and sense amplifier enable (SAE), in accordance with some embodiments.

The diagram in FIG. 2 shows a working read timing tracking mechanism. The timing mechanism allows the WL to reach the plateau region 235 to allow sufficient reading time. However, as mentioned above, variances across the memory array due to process, voltage, and temperature ("PVT") could affect reading time. FIG. 3 is a graph of signal curves of various lines and corresponding SAE, in accordance with some other embodiments. Signal curve 310 shows the signal level of the TWL used for FIG. 2 as a function of time. Similarly, signal curve 320 shows the signal level of the TBL, and signal curve 330 shows the signal curve of the word line (WL) in SRAM 100 described above. Signal curve 340 shows the signal level of SAE. FIG. 3 indicates that the TWL receives a signal at a time $t_{311}$ to change the signal from a low to a high (see curve 310). The signal also turns on WL (see curve 330). However, due to a relatively low threshold voltage Vt, the tracking bit cell(s) is turn on quickly to generate a signal at a time $t_{321}$ at the TBL (curve 320). The signal at TBL generates an SAE signal at a time $t_{341}$. Due to the relatively low Vt, or a combination of low Vt, low Vt/$V_{DD}$ ratio, and low rising slope of the TWL and the WL (313 and 333, respectively) signal curves, the signal curves TWL 310 and WL 330 do not reach plateau regions similar to region 235 of FIG. 2. As a result, there is insufficient read time to properly determine a value stored in the memory cell. The issues of relatively low Vt, low Vt/$V_{DD}$ ratio, and/or low rising slopes of TWL and WL signal curves described above are results of PVT effects.

In order to resolve the issue of insufficient read time, SAE timing (or word line disable time) are delayed to form a plateau region in the WL curve. Slowing down the onset of SAE signal (or delay SAE signal) provides a plateau region in the WL timing curve to allow sufficient reading time, in some embodiments.

In addition, scalable memory systems satisfy technical and product trends. Memory compilers are used to create configuration of different sizes (or rows and columns) of memories. Different memory systems would have different sizes with different numbers of rows and/or columns. Different types of memory cells in a memory system and different sizes of the memory system can affect a duration of a sufficient read time. A timing tracking mechanism accommodates timing tracking of different configurations of memory systems to be used along with a memory compiler used to configure memory arrays, in some embodiments. Therefore, in some embodiments, a read time tracking mechanism works with memory arrays with different configurations, which have different widths and lengths.

Figure 4:
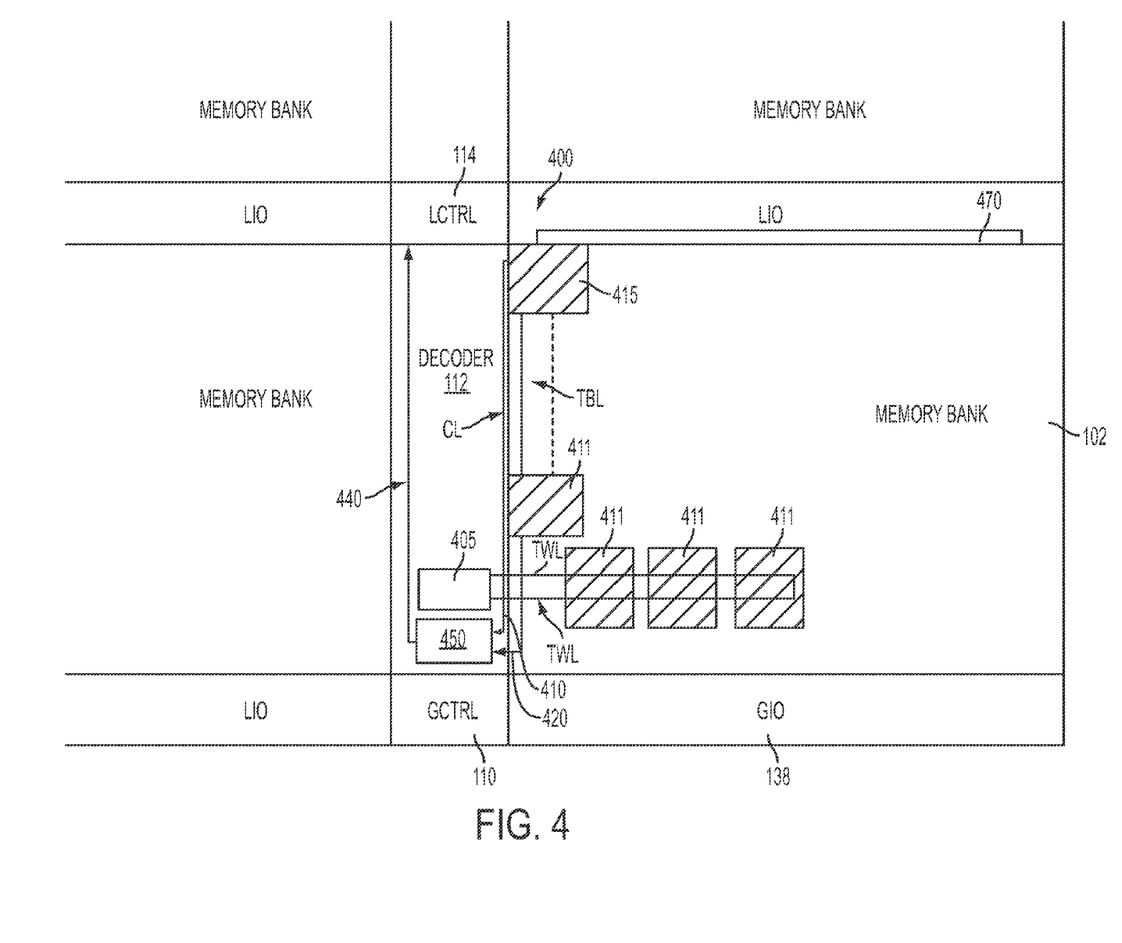
FIG. 4 is a block diagram of a portion of a memory macro with a read tracking circuit, in accordance with some embodiments.

FIG. 4 is a block diagram of a portion of a memory macro 100 with a read tracking circuit 400, in accordance with some embodiments. A read clock signal is generated by a clock generator (not shown), which is part of GCTRL circuit 110. The read clock signal is sent to a tracking WL driver 405, which is part of the read tracking circuit 400 and enhances the read clock signal to become enhanced read clock signal 410. The tracking WL driver 405 is disposed in one of the regions of address decoders 112, in some embodiments. The enhanced read clock signal 410 travels along TWL, which connects with a number of loading cells 411. In some embodiments, a length of TWL is half of width X of memory bank 102. The read clock signal 410 travels the length of TWL and returns back to the region of address decoder 112 with the tracking WL driver 405. The total distance traveled by the read clock signal 410 is the total width X of memory bank 102. However, other lengths of TWL are also possible.

The (returned) read clock signal 410 becomes the input of an SAE timing device 450. The returned read clock signal 410 also travels along a circuit line (CL), which runs parallel to a TBL and connects to one or more tracking cells 415 at the end of TBL, as shown in FIG. 4 in accordance with some embodiments. The output of the tracking cell(s) 415 is connected to the TBL. In addition to tracking cell(s) 415, there are a number of loading cells 411 connected to the TBL. In some embodiments, the tracking cell(s) 415 is near an end of the TBL distant from the TWL and is placed near an LIO 106 next to memory bank 102. As a result, a length of TBL covers at least a length of memory bank 102. An output signal 420 of tracking cell(s) 415 travels along TBL and becomes an input of the SAE timing device 450.

Figure 5A:
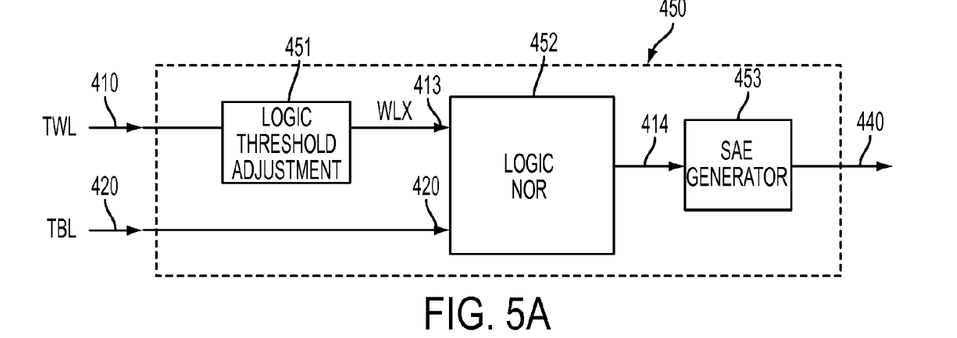
FIG. 5A is a block diagram of an SAE timing device, in accordance with some embodiments.

SAE timing device 450 receives signal 410 from TWL and signal 420 from TBL and generates SAE signal 440. The SAE timing device 450 is designed to reduce the risk of insufficient read time described above. FIG. 5A is a block diagram of an SAE timing device 450 in accordance with some embodiments. SAE timing device 450 receives signals 410 and 420 from the TWL and the TBL, respectively, as input signals and generates SAE signal 440, which then turns on an SA 470 in LIO 106.

The SAE timing device 450 includes a logic threshold adjustment device 451, which changes the logic threshold of the TWL. As described above, when Vt and/or Vt/$V_{DD}$ ratio are low, and/or the rising slopes of TWL signal curve and WL signal curve are low, the output signal 310 of the TWL could trigger the signal 320 of the TBL and the SAE signal 340 too early to result in insufficient reading time. The logic threshold adjustment device 451 is used to modulate the logic threshold of TWL to delay a timing signal 410 from the TWL when necessary. The logic threshold adjustment device 451 also changes a sign of the signal of TWL to become a WLX (word line transformed) signal 413, as shown in FIG. 5A.

Figure 5B:
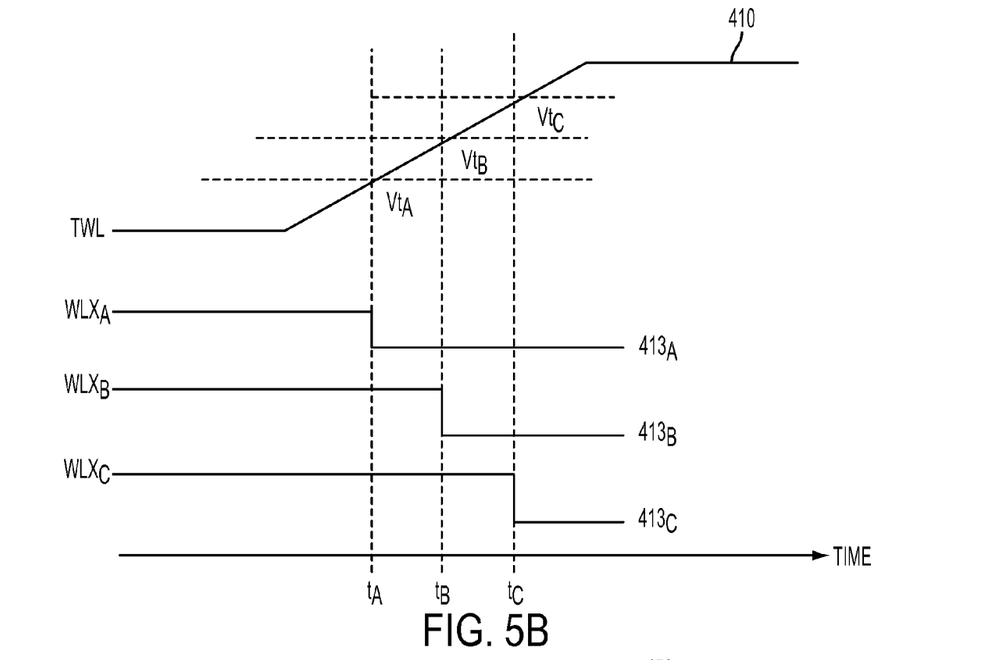
FIG. 5B is a graph of a signal curve of a tracking word line and a number of word line transformed (WLX) signal curves, in accordance with some embodiments.

FIG. 5B is a graph of the signal curve 410 from the TWL and a number of WLX signal curves ($413_A$, $413_B$, and $413_C$), in accordance with some embodiments. By using the logic threshold adjustment device 451, the threshold (voltage) of TWL may be changed to $V_{tA}$, $V_{tB}$, or $V_{tC}$. The adjusted threshold of TWL changes an activation timing of WLX signal 413 to be a time $t_A$, a time $t_B$, or a time $t_C$ as indicated by curves 413$_A$, 413$_B$, or 413$_C$ respectively. As a result, the timing of signal 410 of the TWL can be delayed by logic threshold adjustment device 451. Various devices may be used to form the logic threshold adjustment device 451. For example, a complementary metal-oxide-semiconductor (CMOS) inverter can be used to adjust logic threshold. The logic threshold can be changed by varying the sizes of the PMOS (p-type MOS) transistor and NMOS (n-type MOS) transistor in the CMOS inverter.

Signal 413 from logic threshold adjustment device 451 and signal 410 from the TBL are fed into a logic NOR device 452, which is turned on when both signals 413 and 420 are low. Under slow conditions, the WL to SAE timing is controlled by TBL. However, under fast conditions, such as the ones described above in FIG. 3, the WL to SAE timing is controlled by WLX timing to avoid insufficient read time. WLX timing may be adjusted to meet the requirement of various memory configurations and to resolve PVT effects. An output signal 414 from the logic NOR device 452 is then enhanced by a SAE generator 453 to become SAE signal 440.

Figure 5C:
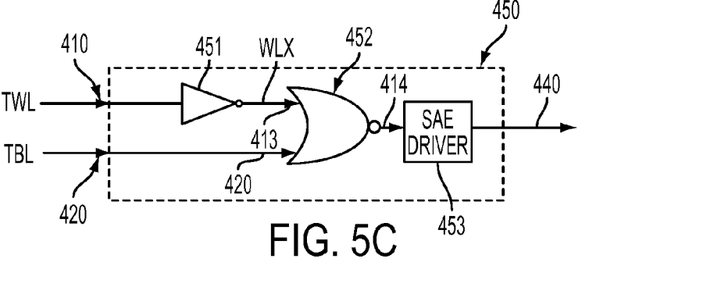
FIG. 5C is a schematic diagram of elements in the logic threshold adjustment device, in accordance with some embodiments.

FIG. 5C is a schematic diagram of elements in the logic threshold adjustment device 450, in accordance with some embodiments. FIG. 5C shows that the logic threshold adjustment device 451 is an inverter, which modifies the TWL signal 410 to become WLX signal 413. The WLX signal 413 from the inverter 451 and the TBL signal 420 are fed to NOR device 452. The output signal 414 of the NOR device 452 is then send to SAE generator 453 to generate the SAE signal 440. In some embodiments, SAE generator 453 is a driver.

Figure 6A:
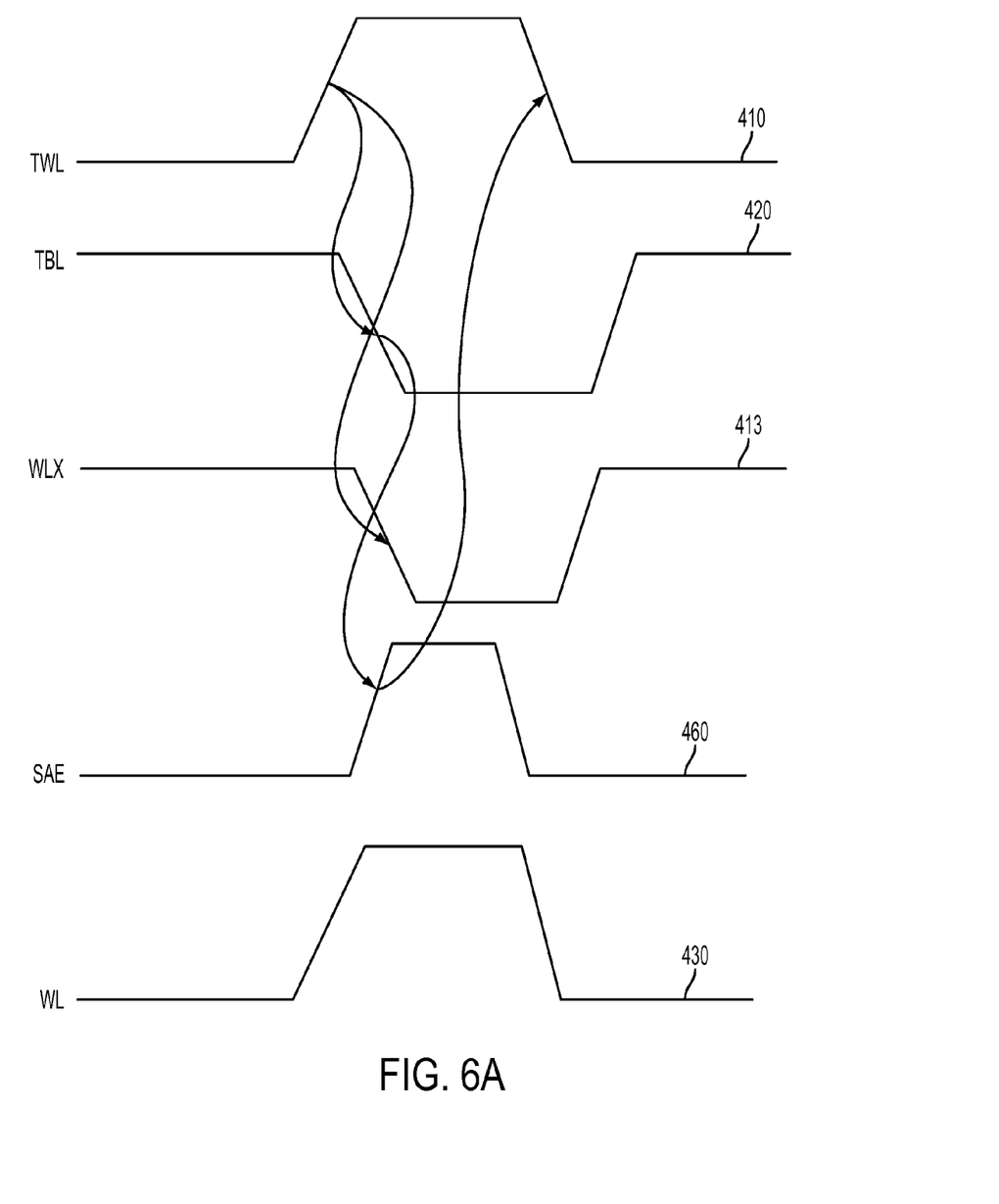
FIGS. 6A-6C are timing diagrams for various signal curves with usage of a SAE logic device to ensure sufficient read time, in accordance with some embodiments.

FIG. 6A is a timing diagram for various signal curves with usage of SAE timing device 450, in accordance with some embodiments. FIG. 6A shows that TWL signal 410 generates TBL signal 420 and received by logic threshold adjustment device 451 to generate WLX signal 413. The TBL signal 420 and WLX signal 413 are fed to the logic NOR device 452, whose output signal (414) is set to SAE generator 453 to become SAE signal 440. The SAE signal 440 controls the turn-off of the TWL to the tracking circuit. In at least the embodiment shown in FIG. 6A, the Vt and Vt/VDD ratio are not low, and the rising slope of TWL signal curve is not low. As a result, the WL to SAE timing is controlled by TBL. In at least the embodiment of FIG. 6A, there is sufficient read time without any adjustment to the logic threshold of TWL.

Figure 6B:
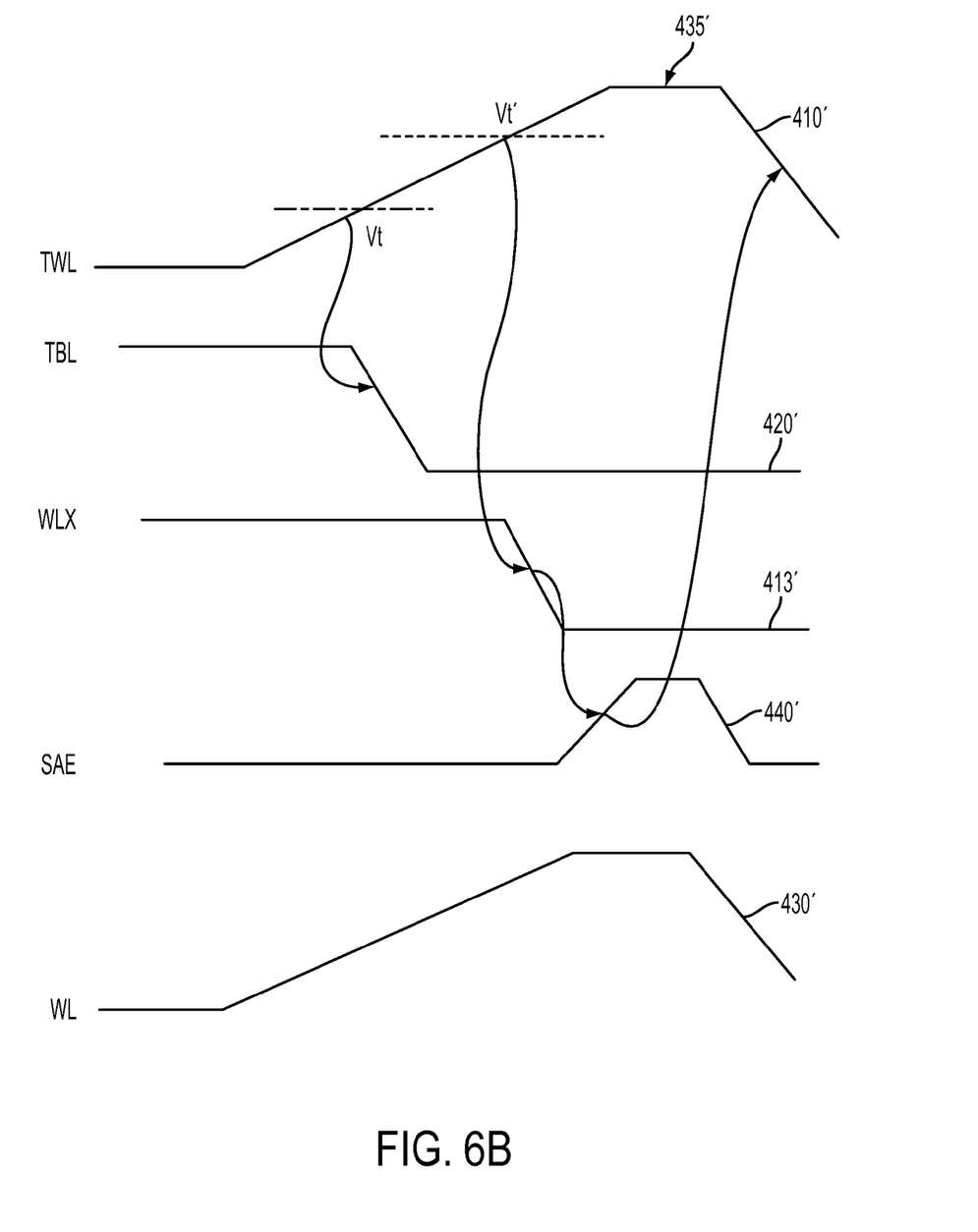

FIG. 6B is a timing diagram for various signal curves with usage of SAE timing device 450, in accordance with some other embodiments. FIG. 6B shows that TWL signal 410' is sent to both the TBL (to generate signal 420') and the logic threshold adjustment device 451 to become WLX signal 413'. TBL signal curve 420' is turned to a low value early due to low Vt. However, the logic threshold adjustment device 451 adjusts the threshold to Vt', which delay the "low" value turn-on time of WLX signal curve 413'. As a result, the turn-on time of SAE signal curve 440' is delayed with respect to the embodiments of FIG. 6A. Due to the delay of WLX signal curve 413', TWL signal curve 410' reaches a plateau region 435' and sufficient reading time is provided. Similarly, WL signal 430' reaches a plateau.

In at least the embodiment of FIG. 6B, the logic threshold adjustment device 451 is used to delay the turn-on time of SAE to achieve a plateau region in TWL signal curve 410' and also WL signal curve 430' to allow sufficient time for reading when the Vt is low or the $V_{DD}$ is relatively high. The logic threshold adjustment by the logic threshold adjustment device 451 can be adjusted based on the various needs of different devices, devices made by different processes, devices for different applications, and devices operated under different conditions.

Figure 6C:
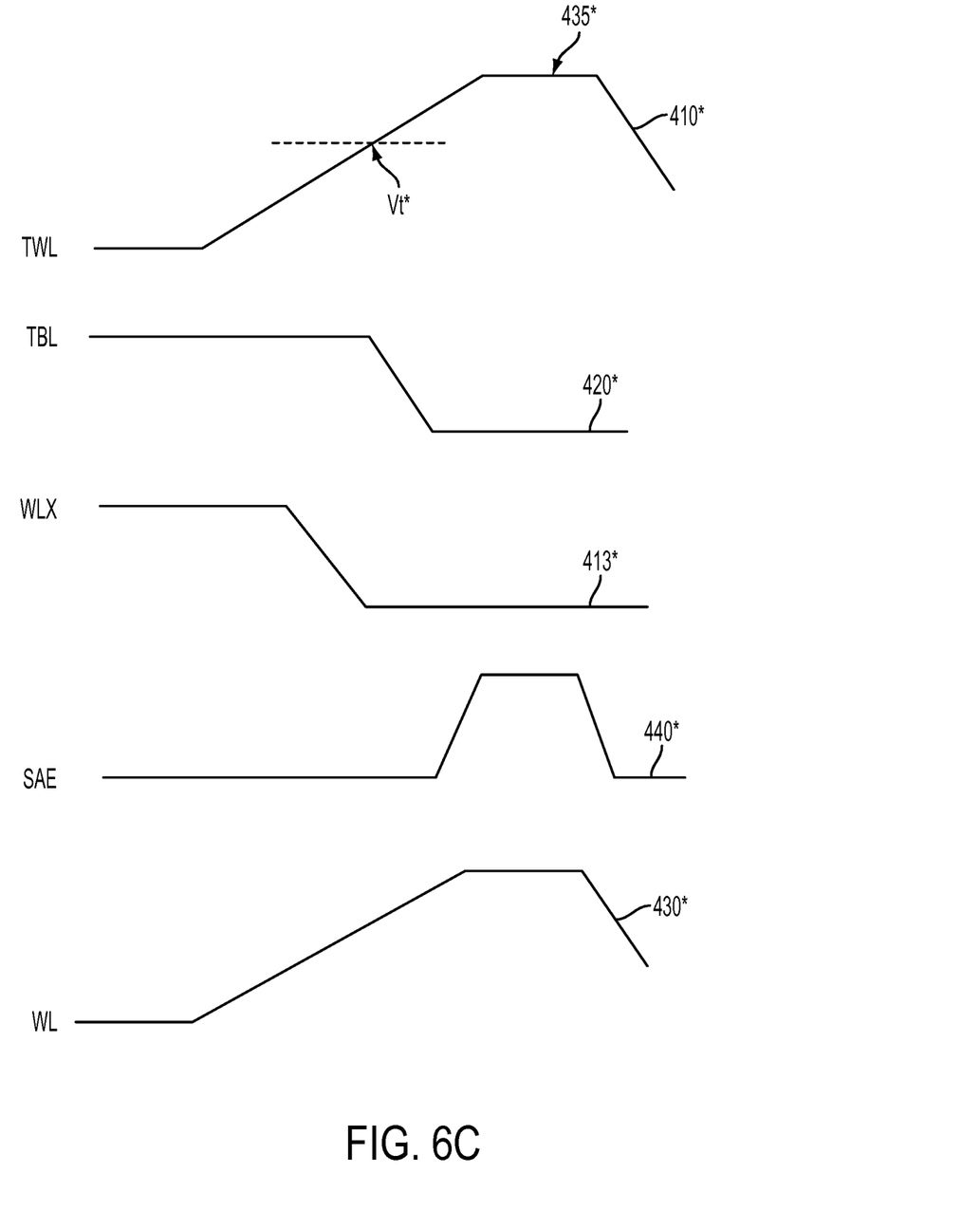

FIG. 6C is a timing diagram for various signal curves with usage of SAE timing device 450, in accordance with some embodiments. FIG. 6C shows that TWL signal 410* has a low slope. TWL signal 410* is sent to both the TBL (to generate signal 420*) and to logic threshold adjustment device 451 to become WLX signal 413*. TBL signal curve 420* is turned to a low value late due to high Vt*. The late start of TBL signal delays the SAE signal 440*. As a result, the TWL signal 410* reaches a plateau 435* and there is a sufficient read time. WL signal 430* is similar to TWL signal 410* and shows sufficient read time. In at least this embodiment, the logic threshold adjustment device 451 also does not adjust the threshold to a higher value.

As mentioned above, memory compilers are used to create configuration of different sizes (or rows and columns) of memories. Different memory systems would have different sizes with different numbers of rows and/or columns. Different configurations of memory arrays would affect the lengths of read time required. In addition, PVT effects of the memory devices influence the function of memory arrays. The read time tracking circuit with the SAE timing device 450 described above provide mechanisms of adjusting logic threshold to help ensure sufficient read time when necessary.

Figure 7:
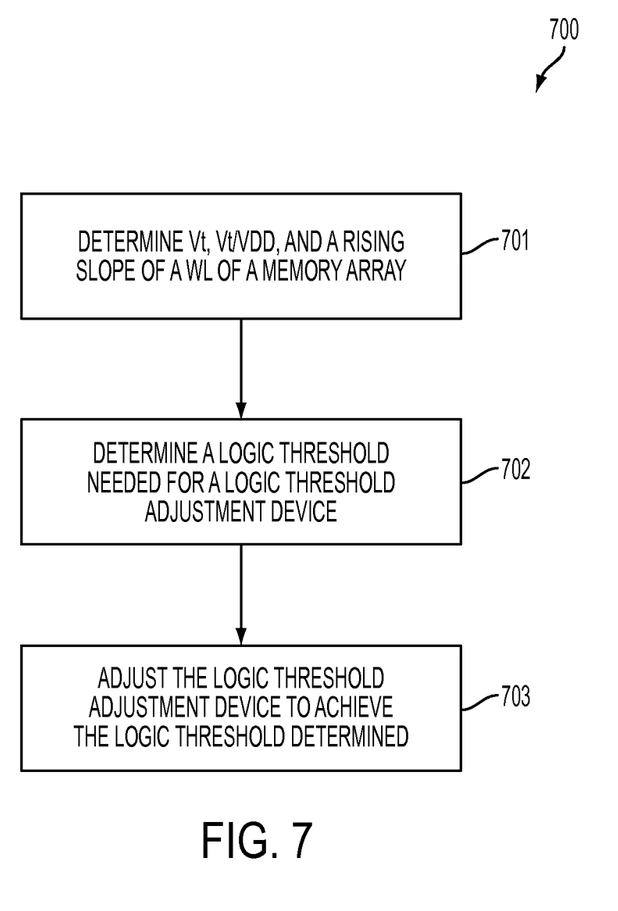
FIG. 7 is a flowchart of a method of adjusting the logic threshold of a logic threshold adjustment device, in accordance with some embodiments.

FIG. 7 is a flow chart of a method 700 of adjusting the logic threshold of the logic threshold adjustment device 451 of an SAE timing device to help ensure sufficient read time, in accordance with some embodiments. At operation 701, the Vt, Vt/V$_{DD}$, and the rising slope of a TWL of a memory array are determined under a targeted operation condition. After the data are collected, the logic threshold adjustment needed for the logic threshold adjustment device 451 is determined at operation 702. The logic threshold adjustment needed is obtained by simulation based on the available Vt, V$_{DD}$, and the rising slope of the TWL. In some embodiments, the simulation is performed on a computer having a processor and a non-transitory computer readable medium configured to store instructions for executing the simulation. Different logic threshold adjustments are tried until the word line reaches a target percentage of V$_{DD}$ at high V$_{DD}$ corner. In some embodiments, the target percentage is in a range from about 80% to about 90%. In some embodiments, the target percentage is equal to or greater than about 90%.

Afterwards, the threshold adjustment device 451 is adjusted to achieve the determined logic threshold at operation 703, if the adjustment is needed. As described above, depending on the PVT (process, operating voltage, and operating temperature) conditions and configuration of the memory array, threshold adjustment might not be needed.

A read time tracking mechanism (RTTM) for ensuring sufficient read time is provided. The read time tracking mechanism includes a read tracking circuit, which includes a tracking bit line (TBL) tracking circuit with one or more tracking cells, and a tracking word line (TWL). The RTTM also includes a sense amplifier enable (SAE) timing device configured to change the logic threshold of tracking WL (TWL) to delay the timing of signal change of TWL when necessary to ensure sufficient read time. The read time tracking mechanism is used to provide sufficient read time for memory arrays with various configurations, prepared under various process conditions, and operated under various voltages, and temperatures.

In some embodiments, a read tracking circuit for a memory array is provided. The read tracking circuit includes a tracking word line (TWL), and the TWL is connected to a first plurality of loading memory cells. The read tracking circuit also includes a tracking bit line (TBL), and the TBL is connected to a tracking cell and a second plurality of loading memory cells. The TWL is electrically connected to the tracking cell. The read tracking circuit further includes a sense amplifier enable (SAE) timing device, and the TWL and the TBL are connected to the SAE timing device. The SAE logic device includes a logic threshold adjustment device, a logic NOR device, and a sense amplifier enable (SAE) generator.

In some embodiments, a semiconductor memory array is provided. The semiconductor memory array includes a segment having two memory banks, and each of the two memory banks includes a plurality of memory cells arranged in rows and columns. The semiconductor memory array also includes a read tracking circuit for a memory array. The read tracking circuit includes a tracking word line (TWL), and the TWL is connected to a first plurality of loading memory cells. The read tracking circuit also includes a tracking bit line (TBL), and the TBL is connected to a tracking cell and a second plurality of loading memory cells. The TWL is electrically connected to the tracking cell. The read tracking circuit further includes a sense amplifier enable (SAE) timing device, and the TWL and the TBL are connected to the SAE timing device. The SAE logic device includes a logic threshold adjustment device, a logic NOR device, and a sense amplifier enable (SAE) generator.

In yet some embodiments, a read timing tracking method of a memory array is provided. The read timing tracking method includes starting a tracking clock to generate a read clock signal, and sending the read clock signal to a TWL driver to generate a TWL signal. The read timing tracking method also includes sending the generated TWL signal to a TWL, and the TWL has a first plurality of loading memory cells. The read timing tracking method further includes generating a TBL signal using an output signal of the TWL, and the TBL is coupled to at least one tracking cell and a second plurality of loading memory cells. In addition, the read timing tracking method includes sending the output signal of the TWL to an SAE timing device, and sending an output signal of the TBL to the SAE timing device. Additionally, the read timing tracking method includes generating an SAE signal using the SAE timing device based on the output signal of the TWL and the output signal of the TBL. The SAE timing device adjusts a logic threshold of the TWL.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A read tracking circuit for a memory array, comprising:
   a tracking word line (TWL), wherein the TWL is connected to a first plurality of loading memory cells;
   a tracking bit line (TBL), wherein the TBL is connected to a tracking cell and a second plurality of loading memory cells, wherein the TWL is electrically connected to the tracking cell; and
   a sense amplifier enable (SAE) timing device, wherein the TWL and the TBL are connected to the SAE timing device, wherein the SAE timing device comprises:
   a logic threshold adjustment device,
   a logic NOR device, and
   a sense amplifier enable (SAE) generator.

2. The read tracking circuit of claim 1, wherein one end of the TWL is connected to a TWL driver and another end of the TWL is connected to the SAE timing device.

3. The read tracking circuit of claim 1, wherein the SAE timing device is coupled to the TWL and the TBL, and wherein the TWL and the TBL are configured to provide input signals for the SAE timing device; and wherein the SAE timing device is configured to provide an SAE signal.

4. The read tracking circuit of claim 1, wherein the TWL is connected to the threshold adjustment device, and the threshold adjustment device and TBL are connected to the logic NOR device, and wherein the logic NOR device is coupled to the SAE generator.

5. The read tracking circuit of claim 1, wherein a length of the TWL is about half a width of the memory array.

6. The read tracking circuit of claim 1, wherein a height of the TBL is about equal to a height of a memory bank of the memory array.

7. The read tracking circuit of claim 1, wherein the logic threshold adjustment device is an inverter and the SAE generator is a driver.

8. The read tracking circuit of claim 1, wherein the SAE timing device is electrically connected to a sense amplifier (SA).

9. The read tracking circuit of claim 1, wherein the SAE timing device is disposed in a decoder region between two memory arrays.

10. The read tracking circuit of claim 1, wherein the logic threshold adjustment device is configured to change a logic threshold of the TWL to delay a signal to the logic NOR device.

11. The read tracking circuit of claim 1, wherein the tracking cell is located at an end of TBL away from the TWL.

12. The read tracking circuit of claim 7, wherein the inverter includes a PMOS transistor and an NMOS transistor, and wherein the logic threshold is changed by varying the sizes of the PMOS transistor and the NMOS transistor.

13. The read tracking circuit of claim 1, wherein the memory array is coupled to a system for storing a memory compiler, wherein the memory compiler configures the memory array.

14. A semiconductor memory array, comprising:
   a segment having two memory banks, wherein each of the two memory banks includes a plurality of memory cells arranged in rows and columns;
   a read tracking circuit for a memory array, comprising:
   a tracking word line (TWL), wherein the TWL is connected to a first plurality of loading memory cells;
   a tracking bit line (TBL), wherein the TBL is connected to a tracking cell and a second plurality of loading memory cells, wherein the TWL is electrically connected to the tracking cell; and a sense amplifier enable (SAE) timing device, wherein the TWL and the TBL are connected to the SAE timing device, wherein the SAE timing device comprises:
  a logic threshold adjustment device,
  a logic NOR device, and
  a sense amplifier enable (SAE) generator.

15. A read timing tracking method of a memory array, comprising:
  starting a tracking clock to generate a read clock signal;
  sending the read clock signal to a tracking word line (TWL) driver to generate a tracking word line (TWL) signal;
  sending the generated TWL signal to a TWL, wherein the TWL has a first plurality of loading memory cells;
  generating a tracking bit line (TBL) signal using an output signal of the TWL, wherein a TBL is coupled to at least one tracking cell and a second plurality of loading memory cells;
  sending the output signal of the TWL to a sense amplifier enable (SAE) timing device;
  sending an output signal of the TBL to the SAE timing device;
  generating an SAE signal using the SAE timing device based on the output signal of the TWL and the output signal of the TBL, wherein the SAE timing device adjusts a logic threshold of the TWL.

16. The read timing tracking method of claim 15, wherein the SAE timing device includes a logic threshold adjustment device to delay the signal from the TWL.

17. The read timing tracking method of claim 15, wherein the SAE timing device includes a logic NOR device selecting a slowest signal from the TBL and the logic threshold adjustment device.

18. The read timing tracking method of claim 15, wherein the logic threshold of the TWL is determined based on pre-determined data of a Vt, a Vt/$V_{DD}$ ratio, and a rising slope of a word line of the memory array.

19. The read timing tracking method of claim 18, wherein the logic threshold of the TWL enables the word line reaches a target percentage of $V_{DD}$ at high $V_{DD}$ corner.

20. The read timing tracking method of claim 19, wherein the target percentage is equal to or greater than about 90%.

* * * * *